US011398277B2

(12) United States Patent
Kusaka et al.

(10) Patent No.: US 11,398,277 B2
(45) Date of Patent: Jul. 26, 2022

(54) SEMICONDUCTOR STORAGE DEVICE

(71) Applicant: Kioxia Corporation, Tokyo (JP)

(72) Inventors: Takuya Kusaka, Kawasaki (JP); Daisuke Arizono, Yokohama (JP); Yoshikazu Harada, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/200,308

(22) Filed: Mar. 12, 2021

(65) Prior Publication Data

US 2022/0084595 A1 Mar. 17, 2022

(30) Foreign Application Priority Data

Sep. 15, 2020 (JP) .............................. JP2020-154630

(51) Int. Cl.
*G11C 16/32* (2006.01)
*G11C 16/04* (2006.01)
*G11C 16/08* (2006.01)
*G11C 16/24* (2006.01)
*G11C 16/34* (2006.01)
*G11C 16/26* (2006.01)
*G11C 16/10* (2006.01)

(52) U.S. Cl.
CPC .......... *G11C 16/0483* (2013.01); *G11C 16/08* (2013.01); *G11C 16/10* (2013.01); *G11C 16/24* (2013.01); *G11C 16/26* (2013.01); *G11C 16/3459* (2013.01)

(58) Field of Classification Search
CPC ..... G11C 16/10; G11C 16/0483; G11C 16/08; G11C 16/24; G11C 16/26; G11C 16/32; G11C 16/3459
See application file for complete search history.

(56) References Cited

U.S. PATENT DOCUMENTS

| 7,532,520 | B2 | 5/2009 | Yanagidaira et al. |
| 9,418,751 | B1 | 8/2016 | Dutta et al. |
| 11,211,127 | B1* | 12/2021 | Lien .................. G11C 16/24 |
| 2014/0254283 | A1* | 9/2014 | Dong ................. G11C 16/3427 365/185.22 |
| 2019/0392893 | A1* | 12/2019 | Yang .................. G11C 16/08 |
| 2020/0381068 | A1* | 12/2020 | Yu ....................... G11C 16/16 |
| 2021/0202022 | A1* | 7/2021 | Baraskar ............ G11C 16/3459 |
| 2021/0407604 | A1* | 12/2021 | Yabe ................... G06F 9/30101 |

FOREIGN PATENT DOCUMENTS

| JP | 2007-66386 A | 3/2007 |
| JP | 2008-47273 A | 2/2008 |

* cited by examiner

Primary Examiner — Hien N Nguyen
(74) Attorney, Agent, or Firm — Oblon, McClelland, Maier & Neustadt, L.L.P.

(57) ABSTRACT

A semiconductor storage device of an embodiment includes a control circuit configured to execute a writing sequence in which a loop including a program operation that writes data to memory cells and a program verify operation that verifies the data written in the memory cells is repeated a plurality of times by increasing a program voltage by a predetermined step-up voltage each time, the control circuit being capable of executing reading verify that verifies the data written in the memory cells in the writing sequence, and the control circuit detects characteristic variation of a characteristic that causes disturbance, and determines whether to perform the reading verify based on a result of the detection.

22 Claims, 13 Drawing Sheets

FIG.5

| THE NUMBER OF LOOPS / VERIFY LEVEL | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| A VERIFY LEVEL | O | O | O |   |   |   |   |   |   |   |   |   |   |   |   |   |   |   |
| B VERIFY LEVEL |   | O | O | O | O | O |   |   |   |   |   |   |   |   |   |   |   |   |
| C VERIFY LEVEL |   |   |   | O | O | O | O | O |   |   |   |   |   |   |   |   |   |   |
| D VERIFY LEVEL |   |   |   |   |   | O | O | O | O | O |   |   |   |   |   |   |   |   |
| E VERIFY LEVEL |   |   |   |   |   |   |   |   | O | O | O | O |   |   |   |   |   |   |
| F VERIFY LEVEL |   |   |   |   |   |   |   |   |   | O | O | O | O | O |   |   |   |   |
| G VERIFY LEVEL |   |   |   |   |   |   |   |   |   |   |   | O | O | O | O | O | O | O |

FIG. 11

|  | string0 | string1 | string2 | string3 |
|---|---|---|---|---|
| ⋮ | ⋮ | ⋮ | ⋮ | ⋮ |
| WL2 | PAGE8 | PAGE9 | PAGE10 | PAGE11 |
| WL1 | PAGE4 | PAGE5 | PAGE6 | PAGE7 |
| WL0 | PAGE0 | PAGE1 | PAGE2 | PAGE3 |

SEMICONDUCTOR STORAGE DEVICE

CROSS-REFERENCE TO RELATED APPLICATION

This application is based upon and claims the benefit of priority from the prior Japanese Patent Application No. 2020-154630 filed in Japan on Sep. 15, 2020, the entire contents of which are incorporated herein by reference.

FIELD

Embodiments described herein relate generally to a semiconductor storage device.

BACKGROUND

Recently, a three-dimensional structure has been employed for a semiconductor storage device such as a NAND flash memory to meet requests for further refinement and larger volumes. In the NAND flash memory, a memory cell is configured not only as a single level cell (SLC) capable of latching one-bit (two-value) data but also as a multi-level cell (MLC) capable of latching two-bit (four-value) data, a triple level cell (TLC) capable of latching three-bit (eight-value) data, or a quad level cell (QLC) capable of latching four-bit (16-value) data in some cases.

When the memory cell has a multiple-value configuration in this manner, it is requested to highly accurately control a threshold voltage of the memory cell. However, memory hole leakage is likely to occur due to the three-dimensional structure of the memory cell, and rising defect of the threshold voltage due to disturbance in a writing operation (false writing due to unintended increase of the threshold voltage) occurs in some cases.

Thus, reading verify that performs a reading operation after the writing operation and checks normal writing is performed.

However, in this case, an operation time of the writing operation increases by a time taken for the reading verify and performance degrades, which has been a problem.

BRIEF DESCRIPTION OF THE DRAWINGS

FIG. 5 is a diagram for description of an exemplary standard writing sequence;

FIG. 11 is an explanatory diagram illustrating a unit of writing;

DETAILED DESCRIPTION

A semiconductor storage device of an embodiment includes: a memory cell array including a plurality of memory cells; a plurality of word lines connected with respective gates of the plurality of memory cells; a word line driver configured to apply a program voltage to the word lines at writing of data to the plurality of memory cells; a plurality of bit lines each connected with one end of a corresponding one of the plurality of memory cells; a bit line driver configured to apply a bit line voltage to the plurality of bit lines and detect data in the plurality of memory cells through the plurality of bit lines; and a control circuit configured to control the word line driver and the bit line driver to execute a writing sequence in which a loop including a program operation that writes data to the memory cells and a program verify operation that verifies the data written in the memory cells is repeated a plurality of times by increasing the program voltage by a predetermined step-up voltage each time, the control circuit being capable of executing reading verify that verifies the data written in the memory cells in the writing sequence, and the control circuit detects characteristic variation of a characteristic that causes disturbance, and determines whether to perform the reading verify based on a result of the detection.

Embodiments of the present invention will be described below in detail with reference to the accompanying drawings.

(First Embodiment)

In the present embodiment, determination (hereinafter referred to as characteristic variation determination) is performed on probability that disturbance occurs and the degree of adverse influence of the disturbance, whether to perform reading verify is determined based on a result of the above determination, and the reading verify is performed only when needed, thereby improving performance.

(Configuration of Memory System)

Figure 1:
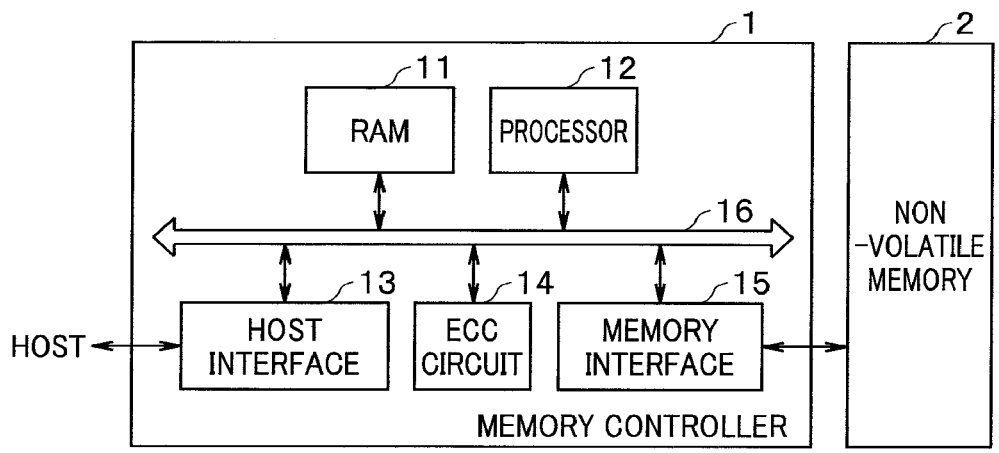
FIG. 1 is a block diagram illustrating an exemplary configuration of a memory system according to an embodiment.

FIG. 1 is a block diagram illustrating an exemplary configuration of a memory system according to an embodiment. The memory system of the present embodiment includes a memory controller 1 and a non-volatile memory 2. The memory system is connectable with a host. The host is an electronic device such as a personal computer or a portable terminal.

The non-volatile memory 2 is a semiconductor storage device configured to store data in a non-volatile manner and includes, for example, a NAND flash memory. In the present embodiment described below, the non-volatile memory 2 is a NAND memory including memory cells and capable of storing three bits per memory cell, in other words, a 3bit/Cell (triple level cell (TLC)) NAND memory, but is not limited thereto. The non-volatile memory 2 has a three-dimensional structure.

The memory controller 1 controls writing of data to the non-volatile memory 2 in accordance with a writing request from the host. In addition, the memory controller 1 controls reading of data from the non-volatile memory 2 in accordance with a reading request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected with one another through an internal bus 16.

The host interface 13 outputs a request received from the host, write data that is user data, and the like to the internal bus 16. In addition, the host interface 13 transmits user data read from the non-volatile memory 2, a response from the processor 12, and the like to the host.

The memory interface 15 controls, based on an instruction from the processor 12, processing that writes user data or the like to the non-volatile memory 2 and processing that reads user data or the like from the non-volatile memory 2.

The processor 12 collectively controls the memory controller 1. The processor 12 is, for example, a central processing unit (CPU) or a micro processing unit (MPU). When having received a request from the host through the host interface 13, the processor 12 performs control in accordance with the request. For example, the processor 12 instructs the memory interface 15 to write user data and parity to the non-volatile memory 2 in accordance with a request from the host. In addition, the processor 12 instructs the memory interface 15 to read user data and parity from the non-volatile memory 2 in accordance with a request from the host.

The processor 12 determines a storage region (hereinafter referred to as a memory region) in the non-volatile memory 2 for user data accumulated in the RAM 11. The user data is stored in the RAM 11 through the internal bus 16. The processor 12 performs determination of a memory region for data per page as the unit of writing, in other words, page data. In the present specification, user data stored in one page in the non-volatile memory 2 is defined as unit data. The unit data is, for example, encoded and stored in the non-volatile memory 2 as a code word.

Note that the encoding is not essential. The memory controller 1 may store unit data in the non-volatile memory 2 without encoding, but FIG. 1 illustrates an exemplary configuration in which the encoding is performed. When the memory controller 1 does not perform the encoding, page data is identical to unit data. One code word may be generated based on one piece of unit data, or one code word may be generated based on divided data into which unit data is divided. Alternatively, one code word may be generated by using a plurality of pieces of unit data.

The processor 12 determines, for each unit data, a memory region in the non-volatile memory 2 as a writing destination. A physical address is allocated to each memory region in the non-volatile memory 2. The processor 12 manages a memory region as the writing destination of each unit data by using the physical address. The processor 12 specifies the physical address of the determined memory region and instructs the memory interface 15 to write user data to the non-volatile memory 2. The processor 12 manages correspondence between a logical address (logical address managed by the host) and the physical address of the user data. When having received a reading request including a logical address from the host, the processor 12 specifies a physical address corresponding to the logical address and instructs the memory interface 15 to read user data with specification of the physical address.

The ECC circuit 14 generates a code word by encoding user data stored in the RAM 11. In addition, the ECC circuit 14 decodes a code word read from the non-volatile memory 2.

The RAM 11 temporary stores user data received from the host until storage in the non-volatile memory 2, or temporary stores data read from the non-volatile memory 2 until transmission to the host. The RAM 11 is a general-purpose memory such as a static random access memory (SRAM) or a dynamic random access memory (DRAM).

FIG. 1 illustrates an exemplary configuration in which the memory controller 1 includes the ECC circuit 14 and the memory interface 15. However, the ECC circuit 14 may be built in the memory interface 15. Alternatively, the ECC circuit 14 may be built in the non-volatile memory 2.

When having received a writing request from the host, the memory controller 1 operates as follows. The processor 12 temporary stores write data in the RAM 11. The processor 12 reads the data stored in the RAM 11 and inputs the data to the ECC circuit 14. The ECC circuit 14 encodes the input data and provides a code word to the memory interface 15. The memory interface 15 writes the input code word to the non-volatile memory 2.

When having received a reading request from the host, the memory controller 1 operates as follows. The memory interface 15 provides a code word read from the non-volatile memory 2 to the ECC circuit 14. The ECC circuit 14 decodes the input code word and stores decoded data in the RAM 11. The processor 12 transmits the data stored in the RAM 11 to the host through the host interface 13.

(Configuration of Non-Volatile Memory)

Figure 2:
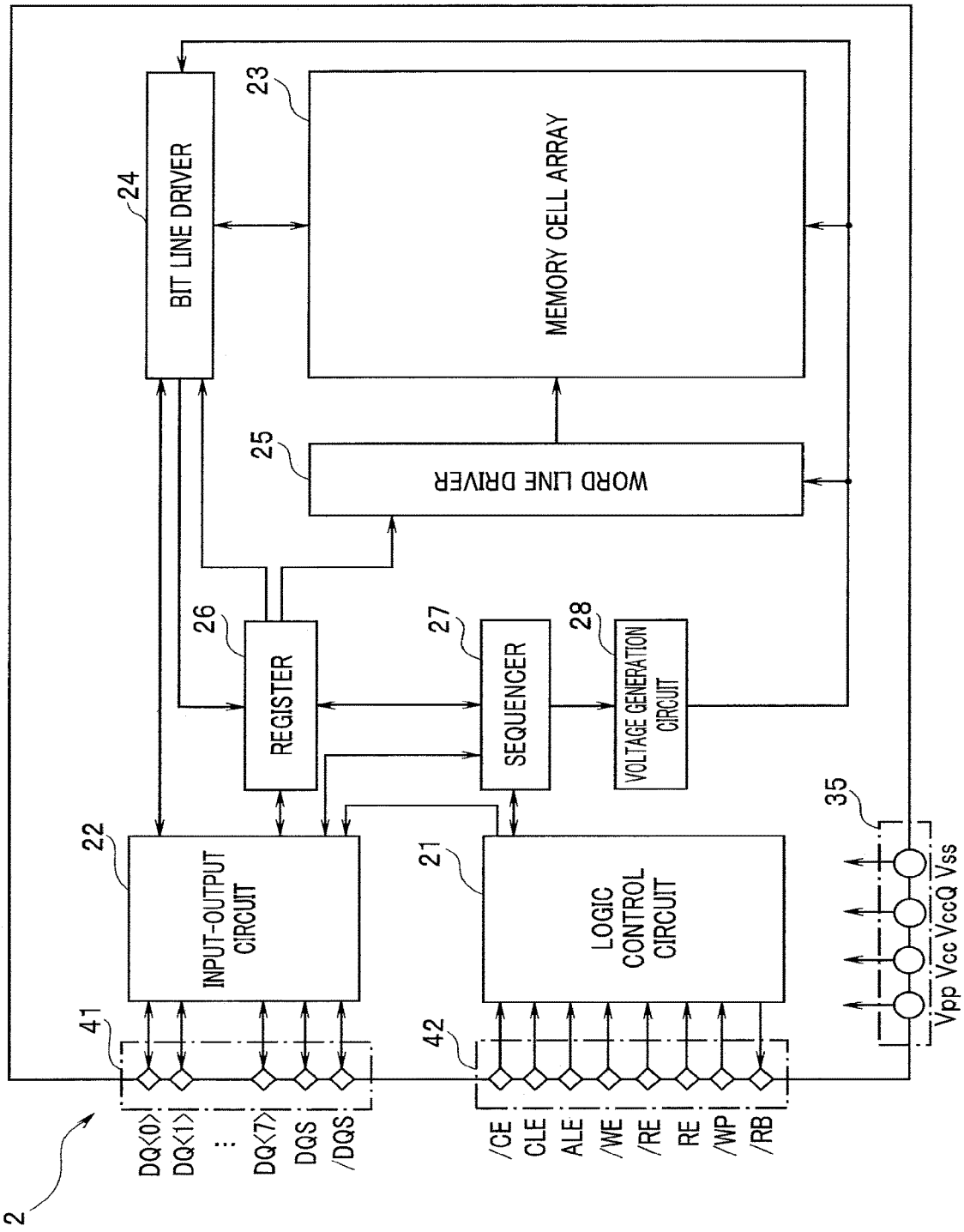
FIG. 2 is a block diagram illustrating an exemplary configuration of a non-volatile memory of the present embodiment.

FIG. 2 is a block diagram illustrating an exemplary configuration of the non-volatile memory of the present embodiment. The non-volatile memory 2 includes a logic control circuit 21, an input-output circuit 22, a memory cell array 23, a bit line driver 24, a word line driver 25, a register 26, a sequencer 27, a voltage generation circuit 28, an input-output pad group 41, a logic control pad group 42, and a power source inputting terminal group 35.

The memory cell array 23 includes a plurality of blocks BLK. Each block BLK includes a plurality of memory cell transistors (memory cells). A plurality of bit lines, a plurality of word lines, a plurality of source lines, and the like are disposed in the memory cell array 23 to control a voltage applied to the memory cell transistors. A specific configuration of the blocks BLK will be described later.

The input-output pad group 41 includes a plurality of terminals (pads) corresponding to signals DQ <7:0> and data strobe signals DQS and/DQS to transmit and receive signals including data to and from the memory controller 1.

The logic control pad group 42 includes a plurality of terminals (pads) corresponding to a chip enable signal /CE, a command latch enable signal CLE, an address latch enable signal ALE, a write enable signal /WE, read enable signals RE and /RE, and a write protect signal /WP to transmit and receive signals to and from the memory controller 1.

The signal /CE enables selection of the non-volatile memory 2. The signal CLE enables latch of a command transmitted as a signal DQ at a command register. The signal ALE enables latch of an address transmitted as a signal DQ at an address register. The signal WE enables writing. The signal RE enables reading. A signal WP inhibits writing and erasure. A signal R/B indicates whether the non-volatile memory 2 is in a ready state (state in which a command from the outside can be received) or a busy state (state in which a command from the outside cannot be received). The memory controller 1 can know the state of the non-volatile memory 2 by receiving the signal R/B.

The power source inputting terminal group 35 includes a plurality of terminals through which power voltages Vcc, VccQ, and Vpp and a ground voltage Vss are input to supply various kinds of operation power sources to the non-volatile memory 2 from the outside. The power voltage Vcc is a circuit power voltage provided as an operation power source typically from the outside, and is input as a voltage of, for example, 3.3 V approximately. The power voltage VccQ is input as a voltage of, for example, 1.2 V. The power voltage VccQ is used to transmit and receive signals between the memory controller 1 and the non-volatile memory 2. The power voltage Vpp is a power voltage higher than the power voltage Vcc and input as a voltage of, for example, 12 V.

The logic control circuit 21 and the input-output circuit 22 are each connected with the memory controller 1 through a NAND bus. The input-output circuit 22 transmits and receives signals DQ (for example, DQ0 to DQ7) to and from the memory controller 1 through the NAND bus.

The logic control circuit 21 receives external control signals (for example, the chip enable signal /CE, the command latch enable signal CLE, the address latch enable signal ALE, the writing enable signal /WE, the reading enable signals RE and /RE, and the write protect signal /WP) from the memory controller 1 through the NAND bus. The symbol "/" in a signal name indicates active low. In addition, the logic control circuit 21 transmits a ready/busy signal /RB to the memory controller 1 through the NAND bus.

The register 26 includes a command register, an address register, and a status register. The command register temporarily latches a command. The address register temporarily latches an address. The status register temporarily latches data necessary for operation of the non-volatile memory 2. The register 26 is configured as, for example, an SRAM.

The sequencer 27 receives a command from the register 26 and controls the non-volatile memory 2 in accordance with a sequence based on the command.

The voltage generation circuit 28 receives a power voltage from the outside of the non-volatile memory 2 and generates, by using the power voltage, a plurality of voltages necessary for a writing operation, a reading operation, and an erasure operation. The voltage generation circuit 28 supplies the generated voltages to the memory cell array 23, the bit line driver 24, the word line driver 25, and the like.

The word line driver 25 receives a row address from the register 26 and decodes the row address. The word line driver 25 performs an operation to select a word line based on the decoded row address. Then, the word line driver 25 forwards, to a selected block BLK, a plurality of voltages necessary for the writing operation, the reading operation, and the erasure operation.

The bit line driver 24 receives a column address from the register 26 and decodes the column address. The bit line driver 24, which is connected with each bit line, selects a bit line based on the decoded column address. At data reading, the bit line driver 24 senses and amplifies data read from a memory cell transistor to the bit line. At data writing, the bit line driver 24 forwards write data to the bit line.

At data reading, the bit line driver 24 temporarily latches detected data and serially forwards the data to the input-output circuit 22. At data writing, the bit line driver 24 temporarily latches data serially forwarded from the input-output circuit 22.

(Multi-Plane)

Note that although a non-volatile memory of a single-plane configuration using one memory cell array 23 is described above, a non-volatile memory of a multi-plane configuration in which two or more planes are disposed may be employed.

In the multi-plane configuration, a plurality of memory cell arrays 23 are disposed, and each memory cell array 23 includes the bit line driver 24 and the word line driver 25 that are necessary for drive of the memory cell array 23. Each memory cell array 23 can independently execute the reading operation, the writing operation, and the erasure operation. Thus, the multi-plane configuration includes blocks BLK of an identical structure and can simultaneously write different pieces of data to an identical page of the respective planes.

(Configuration of NAND Memory Cell Array)

Figure 3:
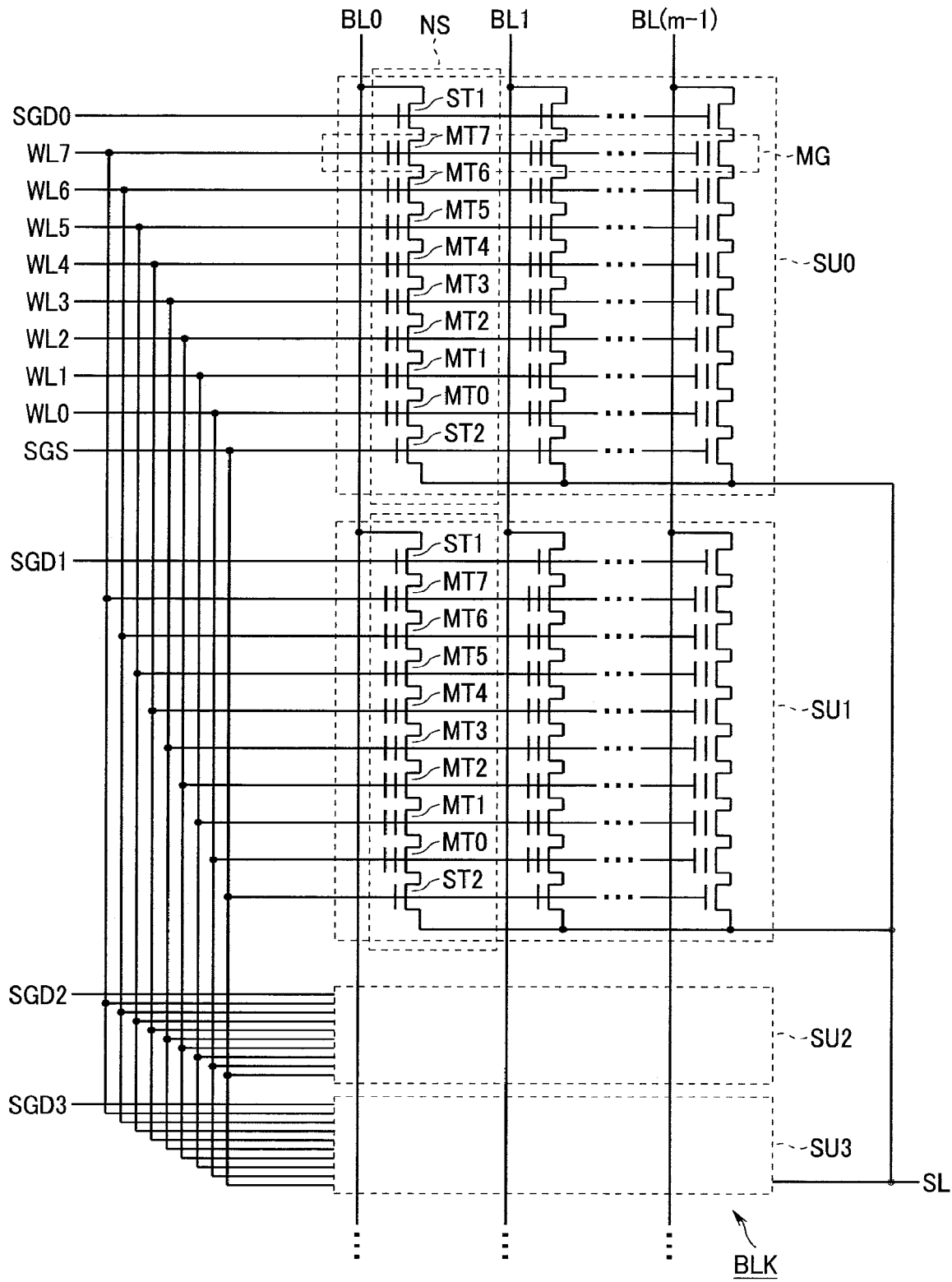
FIG. 3 is a diagram illustrating an exemplary configuration of a block BLK of a NAND memory cell array (hereinafter referred to as a memory cell array) 23 having a three-dimensional structure.

FIG. 3 is a diagram illustrating an exemplary configuration of a block BLK of the NAND memory cell array (hereinafter referred to as a memory cell array) 23 having a three-dimensional structure. FIG. 3 illustrates one block BLK among a plurality of blocks BLK included in the memory cell array 23. The other blocks BLK of the memory cell array each have a configuration same as that in FIG. 3. Note that the present embodiment is also applicable to a memory cell array of a two-dimensional structure.

As illustrated in the drawing, each block BLK includes, for example, four string units (SU0 to SU3). Each string unit SU includes a plurality of NAND strings NS. In this example, each NAND string NS includes eight memory cells MT (MT0 to MT7) and selection transistors ST1 and ST2. Note that the number of memory cells MT included in each NAND string NS is eight in this example, but is not limited to eight and may be, for example, 32, 48, 64, or 96. The selection transistors ST1 and ST2 are each indicated as one transistor in an electric circuit configuration but may be same as a memory cell transistor in a structural configuration. For example, for cutoff characteristic improvement, a plurality of selection transistors may be used as the selection transistors ST1 and ST2, respectively. In addition, dummy cell transistors may be provided between the memory cells MT and the selection transistors ST1 and ST2.

The memory cells MT are disposed between the selection transistors ST1 and ST2 and connected in series with each other. The memory cell MT7 on one end side is connected with the selection transistor ST1, and the memory cell MT0 on the other end side is connected with the selection transistor ST2.

The gates of the selection transistors ST1 of the string units SU0 to SU3 are connected with select gate lines SGD0 to SGD3, respectively. The gates of the selection transistors ST2 of the string units SU0 to SU3 are connected with a select gate line SGS common to the plurality of string units SU in the same block BLK. The gates of the memory cells MT0 to MT7 in the same block BLK are connected in common with word lines WL0 to WL7, respectively. Specifically, the word lines WL0 to WL7 and the select gate line SGS are connected in common to the plurality of string units SU0 to SU3 in the same block BLK, but each select gate line SGD is independent for the corresponding one of the string units SU0 to SU3 in the same block BLK.

The gates of the memory cells MT0 to MT7 included in each NAND string NS are connected with the word lines WL0 to WL7, respectively. The gates of memory cells MTi on the same row in each block BLK are connected with the same word line WLi. Note that in the following description, each NAND string NS is also simply referred to as a "string".

Each NAND string NS is connected with the corresponding bit line. Accordingly, each memory cell MT is connected with the bit line through the selection transistors ST and the other memory cells MT included in the NAND string NS. As described above, data in the memory cells MT in the same block BLK is erased all at once. However, data reading and writing are performed per memory cell group MG (hereinafter referred to as a page). In the present specification, a memory cell group MG is defined to be a plurality of memory cells MT connected with one word line WLi and belonging to one string unit SU. In the present embodiment, the non-volatile memory 2 is a TLC NAND memory that can latch data of three bits (eight values). Thus, one memory cell group MG can latch data of three pages as a data amount. Three bits that can be latched by each memory cell MT correspond to the three pages, respectively.

The operation of data writing to a memory cell MT roughly includes a program operation and a verify operation. The program operation is an operation that increases a threshold voltage of a memory cell MT by injecting electrons into an electric charge accumulation film (or maintains the threshold voltage by inhibiting injection). At the program operation, a control unit 22 controls the word line driver 25 to apply a program voltage VPGM to a word line WL connected with a target memory cell MT, and controls the bit line driver 24 to apply, to a bit line BL connected with the target memory cell MT, a bit line voltage corresponding to data to be written. Note that the bit line voltage and the program voltage VPGM are generated by the voltage generation circuit 28 and supplied to the bit line driver 24 and the word line driver 25.

(Threshold Value Distribution)

When multiple-value data is written to a memory cell MT, the threshold voltage of the memory cell MT is set to a value in accordance with the value of the data. When the program voltage VPGM and a bit line voltage Vbl_L are applied to the memory cell MT, electrons are injected into the electric charge accumulation film and the threshold voltage increases. The threshold voltage of the memory cell MT can be increased by increasing the program voltage VPGM to increase the amount of electron injection. However, the amount of electron injection is different for each memory cell MT even when the same program voltage VPGM is applied due to variance among the memory cells MT. Once injected, the electrons are latched until the erasure operation is performed. Thus, the program voltage VPGM is gradually increased through the writing operation divided into a plurality of times so that the range (hereinafter referred to as a target region) of a threshold voltage allowed as a threshold voltage to be set to each memory cell MT is not exceeded.

Then, after the program operation, the verify operation that determines whether the threshold voltage of a memory cell has reached the target region by reading data is performed. The above-described combination of the program operation and the verify operation is repeated to increase the threshold voltage of the memory cell up to the target region. Writing to the memory cell for which it is determined that the threshold voltage has reached the target region through the verify operation, in other words, a target level that is the lowest value of the target region is exceeded is inhibited thereafter.

Figure 4:
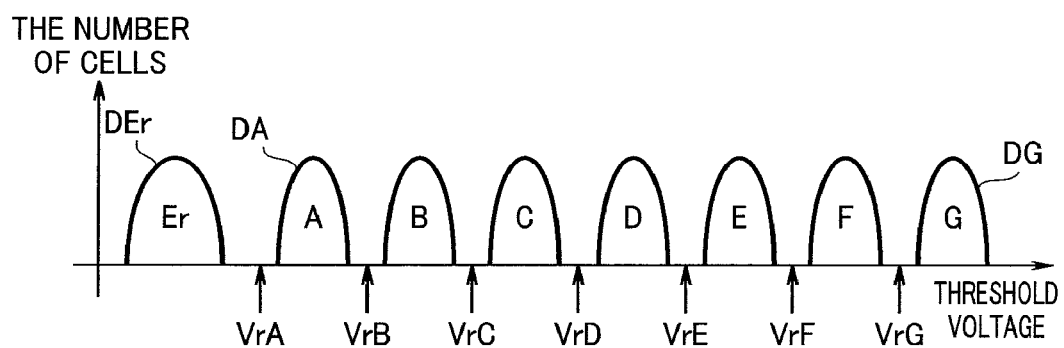
FIG. 4 is a diagram illustrating a threshold value distribution of the memory cell array with a threshold voltage on a horizontal axis and the number of memory cells (the number of cells) on a vertical axis.

FIG. 4 is a diagram illustrating a threshold value distribution of the memory cell array with the threshold voltage on the horizontal axis and the number of memory cells (the number of cells) on the vertical axis. FIG. 4 illustrates an exemplary threshold value distribution of the 3 bit/Cell non-volatile memory 2. In the non-volatile memory 2, the threshold voltage of a memory cell MT is set in accordance with each data value of multiple-value data stored in the memory cell MT. Electric charge injection into the electric charge accumulation film (electric charge latch region) is probabilistic, and thus, the threshold voltage of the memory cell MT statistically distributes as illustrated in FIG. 4.

In FIG. 4, the threshold value distribution is indicated as eight convex regions DEr, DA, DB, DC, . . . , DG, and the width of the threshold voltage in each region corresponds to a target region. In the example illustrated in FIG. 4, eight-value data (three-bit data) can be stored in the memory cell MT by setting the threshold voltage of the memory cell MT to any of the eight target regions.

In the present embodiment, a target region in which a threshold voltage Vth is equal to or lower than a voltage VrA in FIG. 4 is referred to as an Er level, a target region in which the threshold voltage is higher than the voltage VrA and equal to or lower than a voltage VrB is referred to as an A level, a target region in which the threshold voltage is higher than the voltage VrB and equal to or lower than a voltage VrC is referred to as a B level, and a target region in which the threshold voltage is higher than the voltage VrC and equal to or lower than a voltage VrD is referred to as a C level. Similarly, D to G levels are set in accordance with respective voltages as illustrated in FIG. 4.

Specifically, a level indicates a target region corresponding to a data value to be stored in the memory cell MT, and in a three-bit or eight-value case, divided target regions are the eight levels of the Er and A to G levels. Note that threshold value distributions corresponding to the Er, A, B, . . . , F, and G levels, respectively are referred to as distributions DEr, DA, DB, . . . , DF, and, DG, respectively. The voltages VrA to VrG are each a reference voltage at the boundary between target regions. Note that in the verify operation, any of the voltages VrA to VrG may be applied as a verify level (voltage) to a word line WL to perform reading, and it may be determined that the threshold voltage corresponding to the level is reached when a target memory cell MT becomes off. Note that in the following description, the verify voltages VrA to VrG used for verify of the A to G levels are also referred to as A to G verify levels, respectively.

(Standard Writing Sequence)

FIG. 5 is a diagram for description of an exemplary standard writing sequence. FIG. 5 illustrates an example in which data is written as the combination of the program operation and the verify (program verify) operation is repeated 18 times. This repetition operation is referred to as a "loop". The program voltage VPGM in the first loop is set to be a lowest voltage value, and the program voltage VPGM is set to be gradually a larger voltage value as the loop proceeds to the second loop, the third loop, and so on. In FIG. 5, a circle indicates a loop in which the program verify operation can be performed. In each of the A to G levels, the program operation is performed from the first loop up to the loop for which the circle is provided. Hereinafter, the loop of the n-th time among the loops of the first to 18-th times is referred to as the n-th loop.

For example, the program operation for a memory cell MT to be set to the B level is potentially performed by gradually increasing the program voltage VPGM from the first loop to the eighth loop at maximum. The program verify operation is performed only in any loop provided with the circle, and writing to a memory cell MT for which it is determined that the threshold voltage has reached a set target region is inhibited thereafter through the program verify operation.

(Bit Line Driver)

Figure 6:
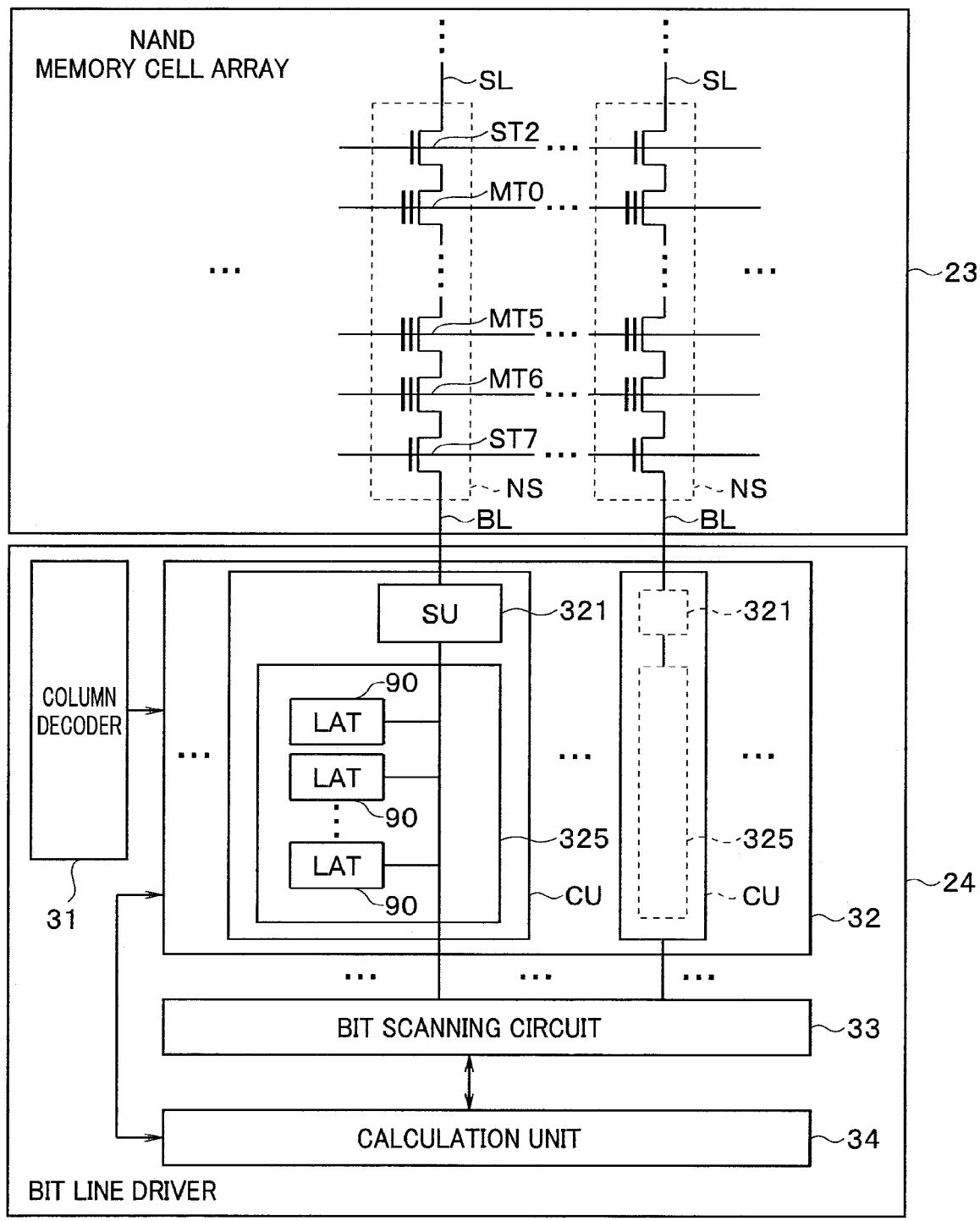
FIG. 6 is a circuit diagram schematically illustrating an exemplary internal circuit of a bit line driver 24 configured to perform determination in a verify operation.

FIG. 6 is a circuit diagram schematically illustrating an exemplary internal circuit of the bit line driver 24 configured to perform determination in the verify operation. The bit line driver 24 is connected with each bit line BL provided in the memory cell array 23. A sense amplifier circuit 32 in the bit line driver 24 senses and amplifies potential variation of each bit line BL and determines data stored in the corresponding memory cells.

The bit line driver 24 includes a column decoder 31, the sense amplifier circuit 32, a bit scanning circuit 33, and a calculation unit 34. The column decoder 31 selects a bit line BL in the memory cell array 23 based on a column address forwarded from the register 26, and drives the sense amplifier circuit 32.

The sense amplifier circuit 32 includes a plurality of column units CU. Each column unit CU is provided for the corresponding bit line BL. Each column unit CU includes one sense unit (SU) 321 and one latch circuit 325. One pair of the sense unit 321 and the latch circuit 325 is provided for the corresponding one bit line BL in the memory cell array 23. In other words, one sense unit 321 and one latch circuit 325 correspond to one bit line BL and a NAND string NS connected with the bit line BL. The one sense unit 321 is connected with the one bit line BL. The one latch circuit 325 is connected with the bit line BL through the sense unit 321.

At data writing, the sense unit 321 charges or discharges the bit line BL under control of the column decoder 31 and the bit scanning circuit 33. At data reading, the sense unit 321 senses potential variation of the bit line BL and determines data.

The latch circuit 325 temporarily latches, for example, setting information (hereinafter referred to as a flag) indicating data to be written to a memory cell, data read from a memory cell, and an operation on a memory cell. In addition, the latch circuit 325 amplifies a signal from the sense unit 321 or a signal from the outside.

The latch circuit 325 includes a plurality of latches (LAT) 90. In the present embodiment, each latch 90 configured to latch data is referred to as data latch 90, and a latch 90 configured to latch a flag is referred to as a flag latch 90. At data writing, each data latch 90 in the latch circuit 325 latches data (data from the outside) to be written to the memory cell group MG corresponding to the latch circuit 325. At data reading, each data latch 90 in the latch circuit 325 latches data read from the memory cell group MG corresponding to the latch circuit 325 (data from the memory cells). Each data latch 90 latches one-bit data.

For example, at program verify, information indicating writing completion is latched based on a program verify result at the latch circuit 325 of the column unit CU corresponding to a memory cell to which writing of predetermined data is completed (memory cell having verify-passed). This prevents continuation of data writing to the memory cell to which writing is completed.

The flag latched by each flag latch 90 in the latch circuit 325 is, for example, information indicating whether input data is two-value (one-bit) data or multiple-value (two-bit or more) data, or information indicating a write mode in which data is to be written. For example, when one memory cell stores four-value (two-bit) data, the latch circuit 325 includes two data latches 90. Among the two data latches provided in the latch circuit 325, one data latch 90 latches the higher-order one bit among the two bits, and the other lower-order data latch 90 latches the lower-order one bit among the two bits. The latch circuit 325 includes one or more flag latches 90. The latch circuit 325 also includes a latch 90 configured to latch a verify result. However, the verify result (also referred to as verify information) may be written to a flag latch or the like.

Note that in a case of four-value data, at least two data latches and at least one flag latch are provided in the latch circuit 325, but the number of data latches increases as the number of bits of data increases. For example, when a memory cell MT stores eight-value (three-bit) data, the latch circuit 325 includes three data latches. Specifically, the latch circuit 325 includes a data latch that latches the most significant bit, a data latch that latches the least significant bit, and a data latch that latches one bit between the most significant bit and the least significant bit. Similarly, the number of data latches in the latch circuit 325 is four in a case of 16-value (four-bit) data, and the number of data latches in the latch circuit 325 is five in a case of 32-value (five-bit) data. The number of flag latches may be one or may be two or more, depending on memory specifications.

In the present embodiment, each latch 90 stores at least one of information of the number of memory cells (hereinafter referred to as the number of passed cells) having verify-passed and information of the number of memory cells (hereinafter referred to as the number of failed cells) having verify-failed. The latch 90 also stores information of various numbers of bits to be described later.

(Verify Operation)

Subsequently, exemplary verify operation will be described below. First, the word line driver 25 applies, to a selection word line, a verify level (voltage) Vr corresponding to a target level, and applies, to a non-selection word line, a non-selection reading voltage VPASS (for example, 5 to 7 V) higher than the verify voltage Vr. At the verify operation, the sequencer 27 controls the bit line driver 24 to fix a bit line BL to a constant voltage (for example, 0.5 V) and charge a sense node SEN (not illustrated) inside the sense unit 321 to a predetermined precharge voltage Vpre higher than the voltage of the bit line BL. In this state, the sequencer 27 connects the sense node SEN to the bit line BL. Accordingly, current flows from the sense node SEN to the bit line BL, and the voltage of the sense node SEN gradually decreases.

The voltage of the sense node SEN changes in accordance with the state of the threshold voltage of a verify target memory cell (selected memory cell). Specifically, when the threshold voltage of the selected memory cell is lower than the verify voltage Vr, the selected memory cell is on, large cell current flows to the selected memory cell, and the voltage of the sense node SEN decreases at a higher speed. When the threshold voltage of the selected memory cell is higher than the verify voltage Vr, the selected memory cell is off, cell current flowing to the selected memory cell is small or no cell current flows to the selected memory cell, and the voltage of the sense node SEN decreases at a slower speed.

Such difference in the decrease speed of the voltage of the sense node SEN is used to determine the state of writing at the selected memory cell, and a verify result is stored in each latch 90. For example, whether the voltage of the sense node SEN is in a low level (hereinafter denoted by "L") or a high level (hereinafter denoted by "H") is determined at a first time point when a predetermined first duration has elapsed since discharging start at which electric charge of the sense node SEN starts discharging. For example, when the selected memory cell is a writing insufficient cell, the threshold voltage of the selected memory cell is lower than the verify voltage Vr and the difference between the voltages is large, and thus the selected memory cell is completely on, and large cell current flows to the selected memory cell. Accordingly, the voltage of the sense node SEN rapidly decreases at a relatively large voltage decrease amount, and the sense node SEN becomes "L" at the first time point.

When the selected memory cell is a writing completed cell, the threshold voltage of the selected memory cell is higher than the verify voltage Vr, and thus the selected memory cell is off and cell current flowing to the selected memory cell is extremely small or no cell current flows to the selected memory cell. Accordingly, the voltage of the sense node SEN extremely gradually decreases at a relatively small voltage decrease amount, and the sense node SEN remains in "H" at the first time point.

In this manner, while the verify voltage Vr is applied to a selection word line by the word line driver 25, the state of the sense node SEN is monitored by the sense amplifier circuit 32 to determine whether a selected memory cell is a writing insufficient cell or a writing completed cell.

The sequencer 27 generates a program voltage in accordance with the level, loop, and the like of a writing target memory cell MT based on a result of the determination of whether the selected memory cell is a writing insufficient cell or a writing completed cell.

(Disturbance)

Figure 7:
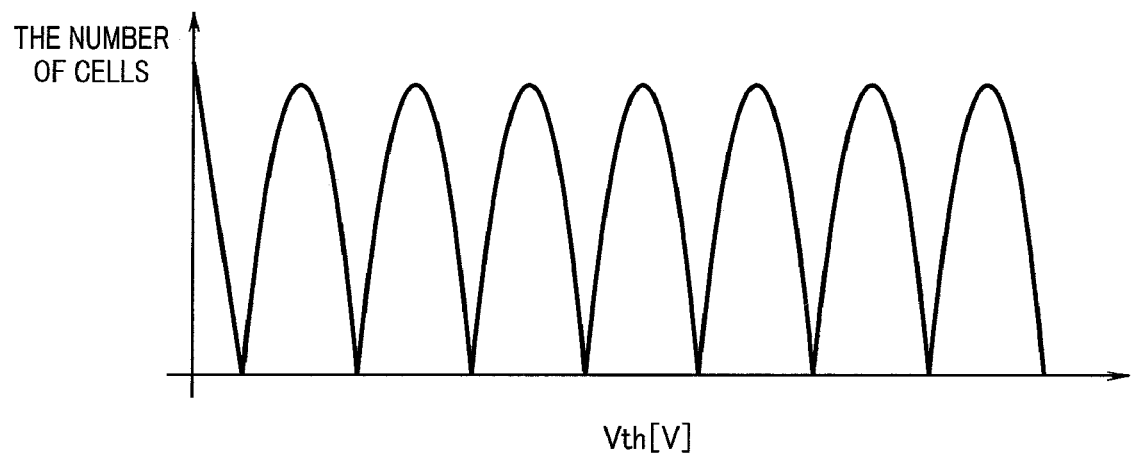
FIG. 7 is a schematic diagram of a graph illustrating a threshold value distribution of each target level with the threshold voltage on the horizontal axis and the number of memory cells on the vertical axis.
Figure 8:
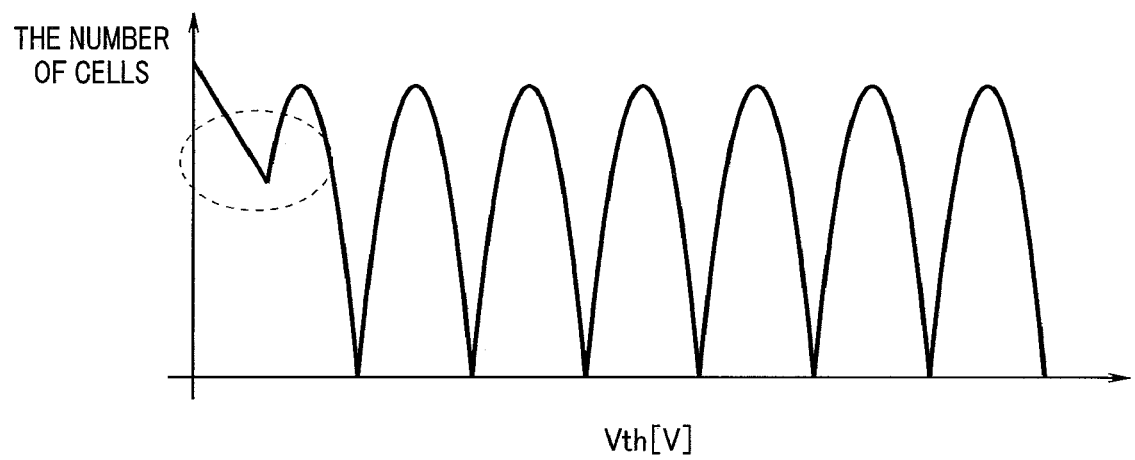
FIG. 8 is a schematic diagram of a graph illustrating the threshold value distribution of each target level with the threshold voltage on the horizontal axis and the number of memory cells on the vertical axis.

Subsequently, disturbance will be described below with reference to FIGS. 7 and 8. FIGS. 7 and 8 are each a schematic diagram of a graph illustrating a threshold value distribution of each target level with the threshold voltage on the horizontal axis and the number of memory cells on the vertical axis: FIG. 7 illustrates normal distribution; and FIG. 8 illustrates distribution when a rising defect of the threshold voltage has occurred. FIGS. 7 and 8 illustrate threshold value distributions of memory cells corresponding to one word line among a plurality of word lines from a lower layer to an upper layer.

The rising defect is such defect that the threshold voltage of a memory cell after writing completion increases beyond a target region. For example, the rising defect occurs when the threshold voltage of a memory cell to which writing is inhibited upon writing completion is affected by writing to another memory cell increases due to memory hole leakage or the like in some cases. The rising defect is sometimes caused by erasure defect that occurs at erasure because a sufficient erasure voltage cannot be applied due to memory hole leakage or the like.

The example illustrated in FIG. 7 indicates that the threshold voltage most exists in a target region for the eight distributions of the Er level and the A to G levels although the distributions are slightly different between word lines. However, the example illustrated in FIG. 8 indicates that the threshold voltage of a memory cell that should be distributed to the Er level increases and rising defect occurs at a part surrounded by a circle.

Note that although the example illustrated in FIG. 8 indicates exemplary rising defect for the Er level, rising defect occurs to any target level. Such occurrence of rising defect due to disturbance may lead to error correction incapability at reading.

The program verify described above determines whether the threshold voltage of a memory cell has reached a set target region, and cannot detect change of the threshold voltage of the memory cell after reaching at the target region. Thus, to determine rising defect (defect that the threshold voltage changes) as illustrated in FIG. 8, the reading verify needs to be performed after end of program loops (for example, after end of the 18 loops in FIG. 5), thereby checking whether writing is normally performed. The reading verify performs reading from the memory cell and detects in which target region the threshold voltage of the memory cell exists. However, the reading verify leads to increase of the operation time of the writing operation, which causes performance degradation.

(Characteristic Variation Determination)

Thus, in the present embodiment, whether a disturbance problem occurs is determined based on a phenomenon at writing. Specifically, defect related to writing potentially occurs at writing when erasure defect and rising defect (hereinafter these are collectively referred to as rising defect or the like) occur due to memory hole leakage or the like. In addition, defect related to erasure potentially occurs at erasure when rising defect or the like occurs. The defect related to writing and the defect related to erasure (hereinafter these are collectively referred to as defect that causes disturbance), which may not occur at product shipment, start occurring due to aging and the like in actual use in some cases.

Thus, in the present embodiment, it is assumed that no defect that causes disturbance occurs in a state at product shipment, and when desired program operation has become not able to be performed, it is determined that defect related to writing has occurred due to some degradation and the probability that disturbance occurs has become high. In the present embodiment, the characteristic variation determination that determines a characteristic as a cause of defect that causes disturbance (hereinafter referred to as a characteristic that causes disturbance) is performed, and the reading verify is performed only when a determination result that the characteristic has varied, in other words, disturbance has become likely to occur is obtained through the characteristic variation determination.

In the present embodiment, for example, the number of program loops, the number of failed cells (the number of incompletely written bits or the number of incompletely erased bits to be described later), a state to be described later, and the like are discussed as characteristics that cause disturbance. The characteristic variation determination is executed at program or at erasure with these characteristics as determination targets of the characteristic variation determination, and the reading verify is performed based on a result of the determination.

The logic control circuit 21 performs the characteristic variation determination and controls the reading verify in accordance with a result of the determination. Specifically, the logic control circuit 21 acquires the above-described determination target information (hereinafter referred to as characteristic information), calculates variation of the information, and determines characteristic variation.

For example, the logic control circuit 21 detects the number of program loops in the writing operation, and the bit line driver 24 detects the number of failed cells. Information of the number of failed cells detected by the bit line driver 24 is forwarded to the logic control circuit 21. The logic control circuit 21 also detects state information.

In the present embodiment, the logic control circuit 21 may record, in a data latch 90 or a predetermined recording region of the memory cell array 23, the characteristic information such as the number of program loops, the number of bits, and the state information thus acquired. When characteristic variation is determined by comparing the characteristic information, for example, in the unit of block BLK, the logic control circuit 21 may perform the characteristic variation determination by recording and reading the characteristic information in a particular region of the memory cell array 23, for example, a particular SLC recording region (hereinafter referred to as a parameter region). For example, when characteristic variation is determined per word line or in the unit of page, the logic control circuit 21 may perform the characteristic variation determination by recording and reading the characteristic information in a data latch 90. Alternatively, the logic control circuit 21 may record the characteristic information in another memory region other than the parameter region and the data latch 90.

In the present embodiment, information as a reference of the characteristic variation determination may be recorded in, for example, the parameter region of the memory cell array 23.

(Effects)

Figure 9:
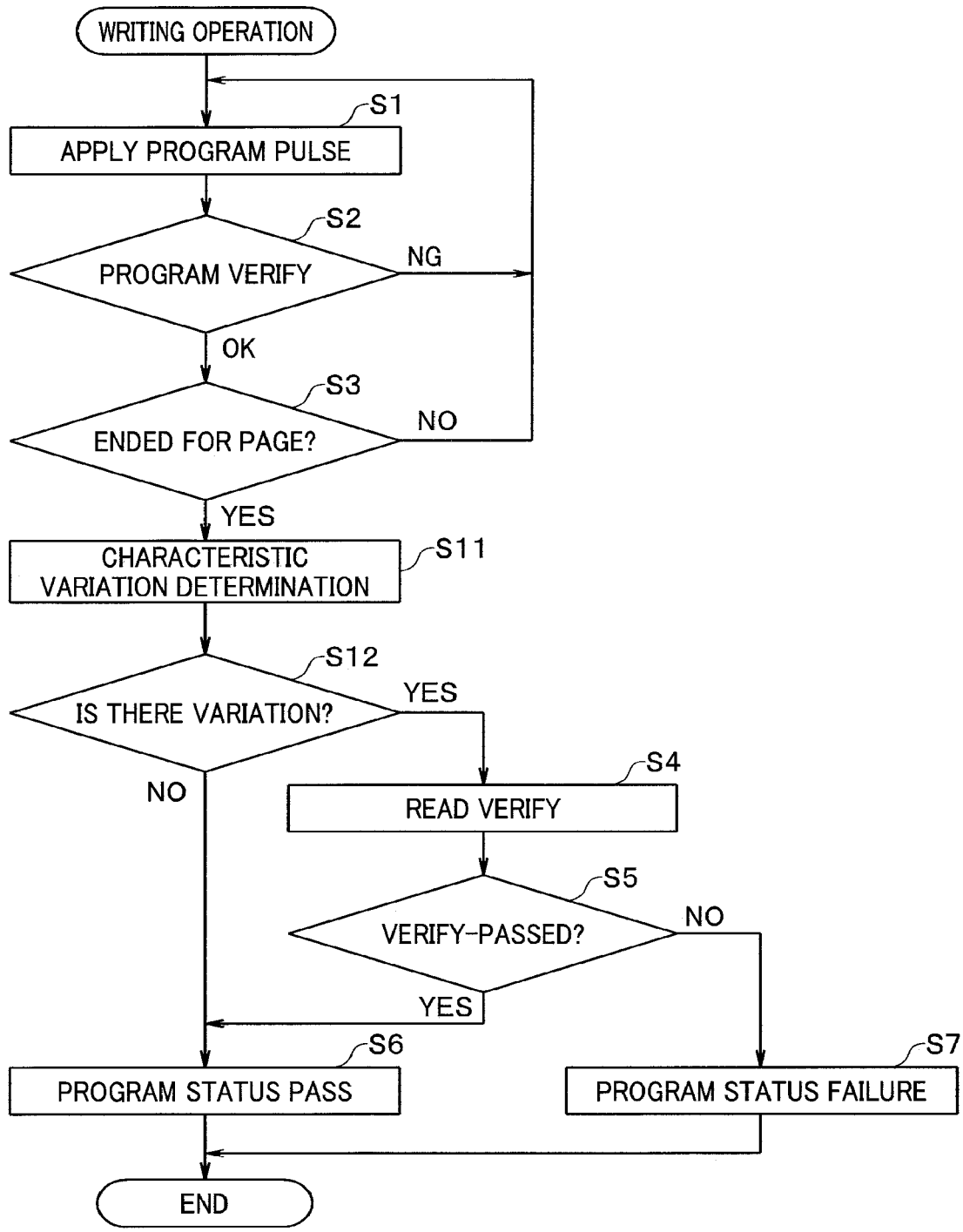
FIG. 9 is a flowchart for description of an operation of a first embodiment.

Subsequently, operation of the embodiment thus configured will be described below with reference to FIGS. 9 to 13. FIG. 9 is a flowchart for description of operation of a first embodiment, and FIG. 10 is a flowchart for description of operation of a comparative example.

Figure 10:
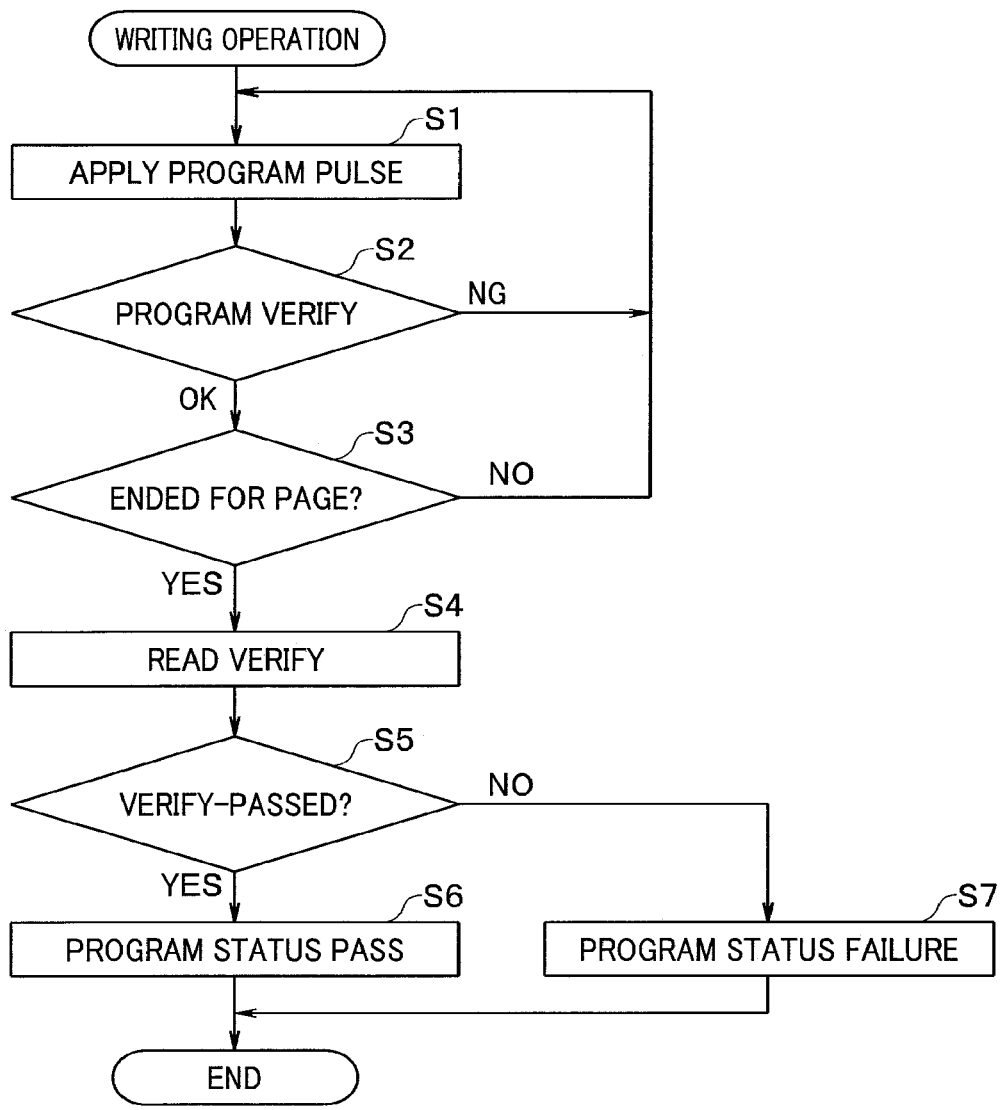
FIG. 10 is a flowchart for description of an operation of a comparative example.

FIG. 9 schematically illustrates the writing operation in the present embodiment, and the comparative example of FIG. 10 illustrates the writing operation when the characteristic variation determination as a feature in the present embodiment is not performed. Note that the same procedure in FIGS. 9 and 10 is denoted by the same reference sign, and duplicate description of the same procedure is omitted.

FIG. 11 is an explanatory diagram illustrating the unit of writing. Writing is performed in the unit of page. In FIG. 11, each NAND string included in the string unit SU0 in FIG. 3 is referred to as a string String0, each NAND string included in the string unit SU1 is referred to as a string String1, each NAND string included in the string unit SU2 is referred to as a string String2, and each NAND string included in the string unit SU3 is referred to as a string String3.

FIG. 11 illustrates an example in which one block BLK is configured as four string units SU. A range written by the word lines WL0, WL1, . . . of each string unit is a page. Thus, one word line WL corresponds to four pages for the respective string units. Note that writing is performed, for example, in the following order of pages 0, 1, 2, . . . .

In the comparative example of FIG. 10, at step S1, the program operation is performed by applying the program voltage VPGM (program pulse) to a word line corresponding to a writing target page. After the program operation, the program verify that determines whether the threshold voltage has reached a desired target voltage is executed. At step S2, it is determined whether a result of the program verify indicates verify pass (OK) or verify failure (NG). In the case of verify failure, the process returns to step S1, and the loop of the program operation and the program verify is executed a plurality of times, and when verify pass is determined, it is determined whether the loop for the writing target page has ended at next step S3.

When the loop for the writing target page has not ended, the process returns to step S1 and the loop of the program operation and the program verify is repeated. When the loop for the writing target page has ended, the reading verify is performed at step S4. At step S5, it is determined whether a result of the reading verify indicates verify pass: in the case of verify pass, it is determined that writing is successful (program status pass) (step S6); or in the case of verify failure, it is determined that writing is not successful (program status failure) (step S7).

In this manner, in the comparative example, the operation time of the writing operation increases due to execution of the reading verify, and accordingly, performance degrades.

However, in the present embodiment, when having determined that the loop for the writing target page has ended at step S3, the logic control circuit 21 performs the characteristic variation determination at next step S11. At step S12, the logic control circuit 21 determines whether characteristic variation has occurred based on a result of the characteristic variation determination. When having determined that no characteristic variation has occurred, the logic control circuit 21 determines that writing is successful (step S6). Thus, the reading verify is not performed in this case.

When having determined that characteristic variation has occurred, the logic control circuit 21 advances the process to step S4 and executes the reading verify. When a result of the reading verify indicates verify pass, the logic control circuit 21 advances from step S5 to step S6 and determines that writing is successful, or when the result of the reading verify indicates verify failure, the logic control circuit 21 advances from step S5 to step S7 and determines that writing is not successful (program status failure).

In this manner, in the present embodiment, since the reading verify is performed only when it is determined through the characteristic variation determination that characteristic variation has occurred, performance of the writing operation can be improved. In addition, occurrence of rising defect or the like can be detected through the characteristic variation determination, and thus whether writing is successful can be reliably determined even when rising defect or the like have occurred after program verify pass.

(Specific Example)

Figure 12:
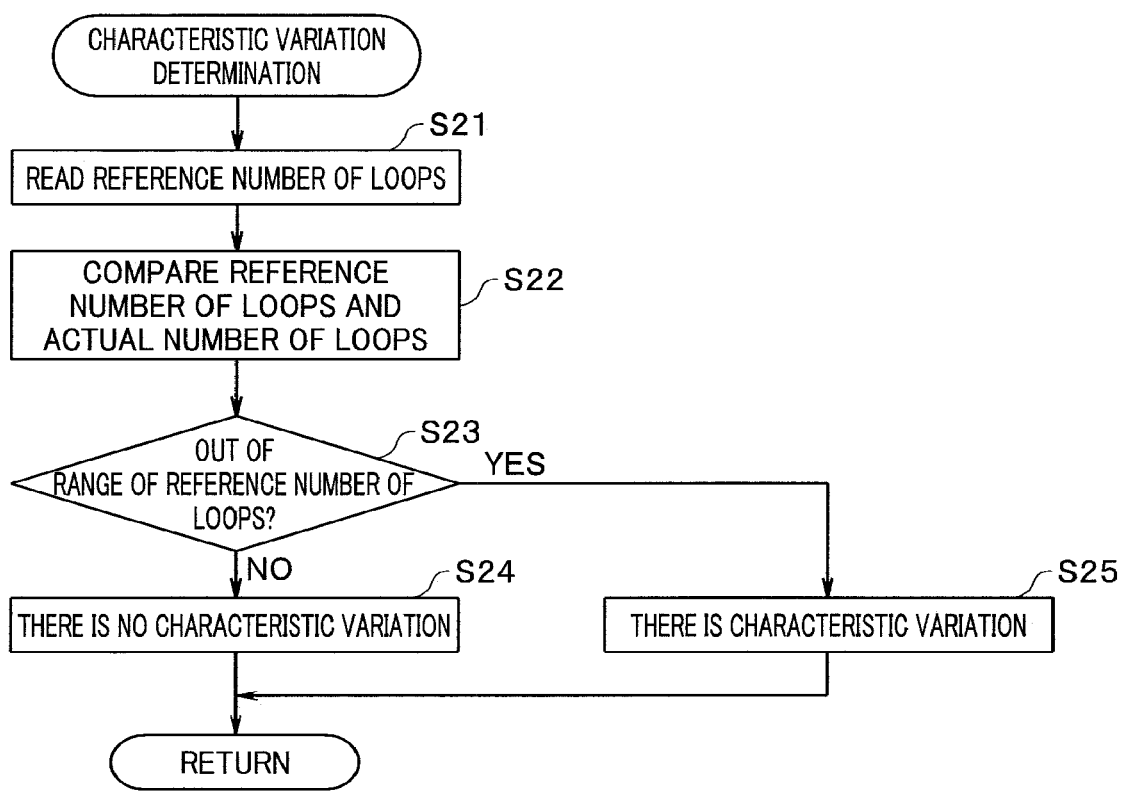
FIG. 12 is a flowchart illustrating exemplary specific processing of characteristic variation determination at step S11 in FIG. 9.

Subsequently, a specific method of the characteristic variation determination at writing will be described below with reference to FIG. 12. FIG. 12 is a flowchart illustrating exemplary specific processing of the characteristic variation determination at step S11 in FIG. 9.

(The Number of Loops)

In the example of FIG. 12, information of the number of loops (hereinafter referred to as a reference number of loops) as a reference of the characteristic variation determination is recorded in, for example, a data latch 90 or the parameter region of the memory cell array 23. Note that the information of the reference number of loops may be recorded at factory shipment or may be changeable by the memory controller 1. The logic control circuit 21 counts the number of loops until the loop of steps S1 to S3 in FIG. 9 ends for the page, and stores a count value of the number of loops in a data latch 90.

When having determined that the loop has ended for the page at step S3 in FIG. 9, the logic control circuit 21 reads the information of the reference number of loops from the memory cell array 23 at step S21 in FIG. 12. At step S22, the logic control circuit 21 compares the actual number of loops stored in the data latch 90 with the reference number of loops. The logic control circuit 21 determines whether the actual number of loops has exceeded a range of the reference number of loops (step S23). When the actual number of loops is equal to or smaller than the reference number of loops, the logic control circuit 21 determines that there is no characteristic variation (step S24), or when the actual number of loops has exceeded the reference number of loops, the logic control circuit 21 determines that there is characteristic variation (step S25).

(Example 1)

For example, when the maximum number of loops for the loop of the program operation and the verify operation for a page is set to 26, it is assumed that the loop ends at, for example, 20 as long as no rising defect nor the like has occurred. In this case, the reference number of loops is set to be, for example, 17 to 23. Thus, when the actual number of loops of the program operation and the verify operation is in the range of 17 to 23, the logic control circuit 21 determines that the actual number of loops is in the range of the reference number of loops and there is no characteristic variation. When the actual number of loops of the program operation and the verify operation is equal to or smaller than 16 or equal to or larger than 24, the logic control circuit 21 determines that the actual number of loops is out of the range of the reference number of loops and there is characteristic variation.

(Example 2)

For example, when no rising defect nor the like has occurred, it is thought that change in the number of loops of the program operation and the verify operation between pages is relatively small. However, it can be determined that rising defect or the like has occurred when there is relatively large difference between the number of loops of the program operation and the verify operation for a page to which writing is previously performed and the number of loops of the program operation and the verify operation for a page to which writing is currently performed. When the determination is to be performed, the number of loops as the difference between the number of loops at the previous writing and the number of loops at the current writing is recorded in a data latch 90.

For example, when the maximum number of loops is set to be 26, the difference in the number of loops between pages is assumed to be three or less as long as no rising defect nor the like has occurred. In this case, the reference number of loops is set to be three and recorded in the parameter region of the memory cell array 23 at factory shipment. The logic control circuit 21 compares the difference in the number of loops recorded in the data latch 90 with the reference number of loops, and when the difference from the previous number of loops of the program operation and the verify is three or less, the logic control circuit 21 determines that the current writing is in the range of the reference number of loops and there is no characteristic variation. When the difference from the previous number of loops of the program operation and the verify is equal to or more than ±4, the logic control circuit 21 determines that the current writing is out of the range of the reference number of loops and there is characteristic variation.

(Example 3)

The memory cell array 23 includes a memory hole having a three-dimensional structure. The memory hole has a tapered shape having a diameter that decreases toward a p-type well region. Depending on a manufacturing process, the memory hole has a tapered shape including a plurality of steps and having a diameter that decreases toward the p-type well region with increase halfway through the tapered shape. With this three-dimensional structure, the diameter of the memory hole differs among the word lines, and accordingly, a writing characteristic differs among the word lines. With taken into account the writing characteristic being different among the word lines in this manner, the word lines are divided into a plurality of groups, and writing voltage setting is performed for each group in some cases.

Thus, as for characteristic variation as well, setting of the reference number of loops may be changed for each group. Note that the reference number of loops for each group is recorded in the parameter region of the memory cell array 23 at factory shipment.

For example, such control is possible that the reference number of loops is set to be ±4 for the word lines WL0 to WL10 and it is determined that there is characteristic variation when there is difference of ±4 loops or more, and the reference number of loops is set to be ±6 for the word lines WL11 to WL20 and it is determined that there is characteristic variation when there is difference of ±6 loops or more.

(Example 4)

The reference number of loops may be changed depending on the program voltage. For example, such control is possible that division is made into a group for which the program voltage is relatively high and a group for which the program voltage is relatively low, the reference number of loops is set to be ±4 when the program voltage is relatively high, it is determined that there is characteristic variation when there is difference of ±4 loops or more, the reference number of loops is set to be ±6 when the program voltage is relatively low, and it is determined that there is characteristic variation when there is difference of ±6 loops or more.

Note that the reference number of loops for each group and a group classification scheme may be changeable not only at factory shipment but also by the memory controller 1.

(Example 5)

The above description (Example 2) is made on the example in which difference in the number of loops of the program operation and the verify operation between a previous page and a current page is compared with the reference number of loops, but difference in the number of loops between pages corresponding to adjacent word lines of the same string may be compared with the reference number of loops.

For example, the logic control circuit 21 compares difference in the number of loops between adjacent pages p and (p+4) belonging to the same string with the reference number of loops (for example, three), and when the difference is equal to or larger than the reference number of loops (three), it is determined that the number of loops is in the range of the reference number of loops and there is no characteristic variation. When difference in the number of loops between the pages p and (p+4) exceeds the reference number of loops (three) (equal to or more than ±4), the logic control circuit 21 determines that the number of loops is out of the range of the reference number of loops and there is characteristic variation. Note that, for the word line WL0 and the page 0, comparison may be performed with values recorded in a predetermined ROM.

(Example 6)

As described above, in a case of the multi-plane configuration, writing to corresponding pages is simultaneously performed at corresponding planes. In this case, the same voltage is supplied to the corresponding planes from the voltage generation circuit 28. Thus, when writing has ended for one plane, applied voltage of writing at another plane sometimes affects the plane for which writing has ended.

Thus, the logic control circuit 21 compares, with the reference number of loops (for example, three), difference in the number of loops taken for writing to the corresponding pages at the corresponding planes, and when the difference is, for example, equal to or smaller than the reference number of loops (three), the logic control circuit 21 determines that the number of loops is in the range of the reference number of loops and there is no characteristic variation. When difference in the number of loops taken for writing at the corresponding planes exceeds the reference number of loops, the logic control circuit 21 determines that the number of loops is out of the range of the reference number of loops and there is characteristic variation.

(Example 7)

FIG. 9 illustrates an example in which characteristic variation is determined after end of writing to each page, but characteristic variation may be determined after end of writing in a particular level. For example, the above-described determination (Examples 1 to 6) may be performed after end of writing in each of the A to G levels, or the above-described determination (Examples 1 to 6) may be performed after end of writing in one predetermined level. For example, when there is a level for which characteristic variation determination can be accurately performed, information of the level may be recorded in the memory cell array 23 at factory shipment, and the above-described determination (Examples 1 to 6) may be performed after end of writing in the level.

(The Number of Bits)

Figure 13:
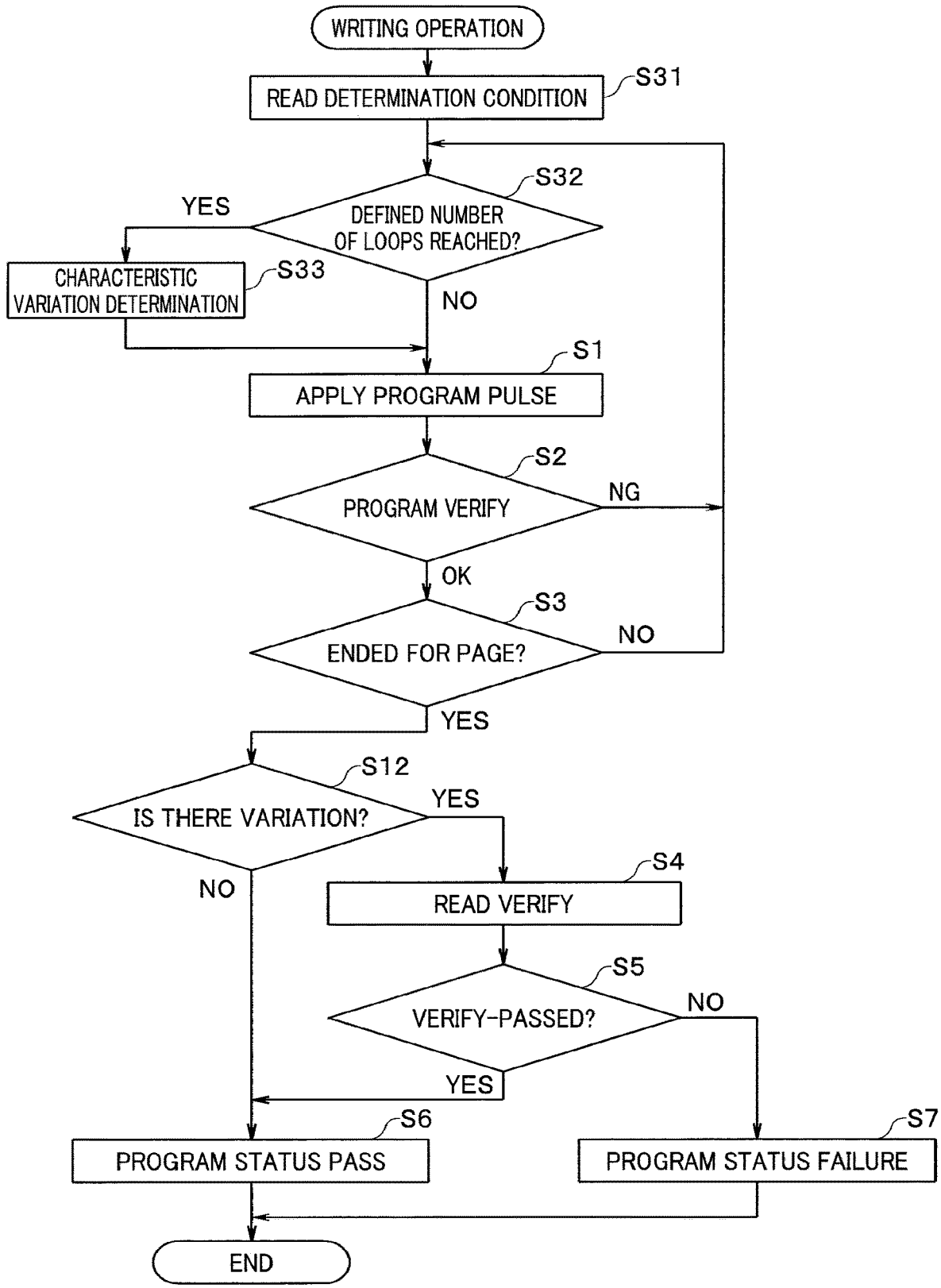
FIG. 13 is a flowchart for description of another specific method of the characteristic variation determination.

FIG. 13 is a flowchart for description of another specific method of the characteristic variation determination. In FIG. 13, a procedure same as a procedure in FIG. 9 is denoted by the same reference sign, and description of the procedure will be omitted. In the process of FIG. 13, steps S31 to S33 are employed in place of step S11 in FIG. 9.

For example, the method of FIG. 13 determines existence of characteristic variation based on difference in the number of incompletely written bits between two simultaneously written pages in multi-plane operation. In this example as well, a determination condition for the characteristic variation determination is recorded in the parameter region of the memory cell array 23 at factory shipment, for example.

In the writing operation, the logic control circuit 21 reads the determination condition (step S31) and determines whether a number of loops defined by the determination condition has been reached (step S32). When the defined number of loops has not been reached, the logic control circuit 21 advances the process to step S1. When the defined number of loops has been reached, the logic control circuit 21 advances the process to step S33 to perform the characteristic variation determination and then advances the process to step S1.

For example, when the defined number of loops is 20 and the 20th loop is reached, the characteristic variation determination at step S33 is executed. The logic control circuit 21 determines that there is characteristic variation when a difference between the number of incompletely written bits at one block BLK and the number of incompletely written bits at another block BLK in the multi-plane configuration is equal to or larger than a predetermined threshold value, or determines that there is no characteristic variation when the difference in the number of incompletely written bits is smaller than the predetermined threshold value.

For example, when the predetermined threshold value is 1000 bits and the number of incompletely written bits is 500 and 1500 or more for the one block BLK and the other block BLK, respectively, in the multi-plane configuration, the difference in the number of incompletely written bits is equal to or larger than 1000, and it is determined that there is characteristic variation.

Note that, in the example of FIG. 13, the characteristic variation determination is performed when the defined number of loops is reached. However, the characteristic variation determination can be performed after end of writing to a target page by employing a bit discount function to end writing in a corresponding level when writing has not been ended but the number of incompletely written bits is equal to or smaller than a defined number of bits. Thus, in this case, the characteristic variation determination based on the number of incompletely written bits can be performed through a process same as the process of FIG. 9.

(Status Failure)

In the multi-plane configuration, at writing to a block BLK of one plane, program status failure indicating that the writing cannot be completed and there is writing defect occurs in some cases. In the characteristic variation determination at step S11 of FIG. 9, the logic control circuit 21 determines whether the program status failure has occurred to the block BLK of the one plane. When the program status failure has occurred, the logic control circuit 21 determines that there is variation at next step S12, and advances the process to step S4 to perform the reading verify for a plane to which no program status failure has occurred.

As described above in each example, the reading verify is performed only when it is determined through the characteristic variation determination that characteristic variation has occurred, and thus performance of the writing operation can be improved.

Note that although the above description is made on the example in which the characteristic variation determination is performed by the logic control circuit 21, the characteristic variation determination may be performed by another block BLK or the memory controller 1.

(Second Embodiment)

Figure 14:
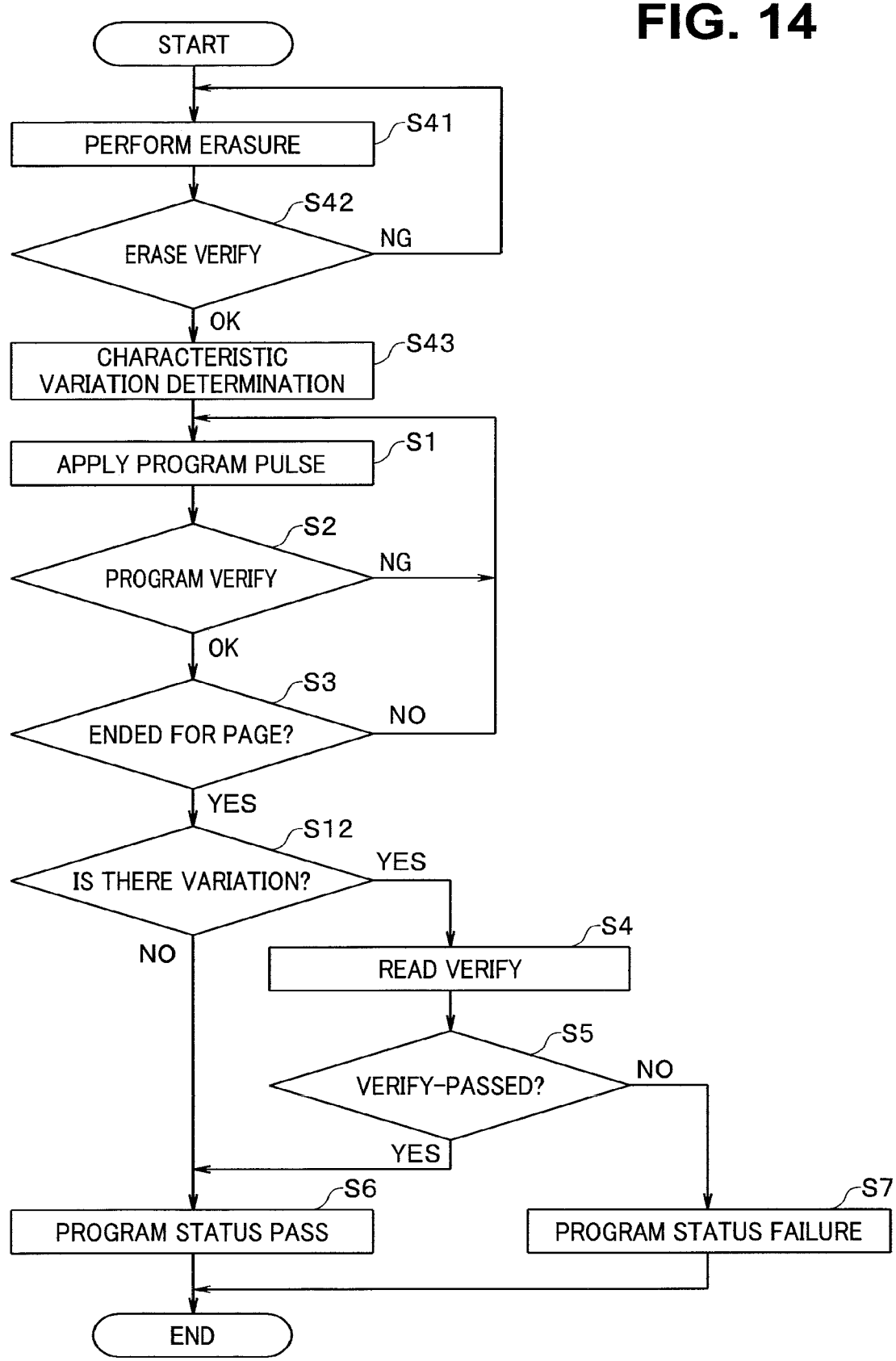
FIG. 14 is a flowchart illustrating an operation flow employed in a second embodiment of the present invention.

FIG. 14 is a flowchart illustrating an operation flow employed in a second embodiment of the present invention. In FIG. 14, a procedure same as a procedure in FIG. 9 is denoted by the same reference sign, and description of the procedure will be omitted. A hardware configuration in the present embodiment is same as the hardware configuration in the first embodiment. In the present embodiment, whether to perform the reading verify at writing is determined by using the characteristic variation determination at erasure. Note that the present embodiment is based on an assumption that the writing operation is performed right after erasure.

In the process of FIG. 14, steps S41 to S43 are employed in place of step S11. Erasure is executed at step S41, and erase verify is executed at step S42.

At erasure, a predetermined high voltage pulse (hereinafter referred to as an erasure pulse) is applied to a source line. Accordingly, electric charge accumulated in the electric charge accumulation film of each memory cell transistor MT of the strings String0 to String3 is ejected to return the threshold voltage of the memory cell transistor MT to the Er level (erasure level).

The erase verify is performed to verify whether each memory cell transistor MT has become the Er level. The erase verify is performed by applying an erase verify voltage corresponding to, for example, the voltage VrA higher than the Er level to the gate of each memory cell transistor MT. A voltage for turning on a selection gate transistor ST2 is applied to the gate of the selection transistor ST2. A voltage for turning on only the gate of a selection gate transistor ST1 included in a verify target NAND string is applied to the selection transistor ST1, a voltage for turning off a selection gate transistor ST1 is applied to the gate of any other selection gate transistor ST1, and the erase verify is performed for each string. As a result of the erase verify, when a verify target memory cell transistor MT has not returned to the erasure level, the erasure pulse is applied again and a loop (erasure loop) of the erasure and the erase verify is repeated.

When having determined that the loop has ended for an erasure target (writing target) page at step S42, the logic control circuit 21 performs the characteristic variation determination at next step S43. Subsequently, the logic control circuit 21 performs the writing operation at steps S1 to S3.

Subsequently at step S12, the logic control circuit 21 determines whether characteristic variation has occurred based on a result of the characteristic variation determination. When characteristic variation such as increase of the number of loops at erasure has occurred, it is thought that rising defect or the like is highly likely to occur in the writing operation. The logic control circuit 21 performs the reading verify at step S4 to S7 only when characteristic variation has occurred. Other effects are same as effects of the first embodiment.

(Specific Examples)
(The Number of Loops)

The process of FIG. 12 may be employed in the present embodiment as well. Specifically, for example, the information of the reference number of loops as the reference of the characteristic variation determination is recorded in a data latch 90 or the parameter region of the memory cell array 23. Note that the information of the reference number of loops in this case is related to erasure and recorded in the memory cell array 23 at factory shipment. In a loop at steps S41 and S42 in FIG. 14, the logic control circuit 21 counts the number of loops until the loop ends for erasure, and records a count value of the number of loops in a data latch 90 or the parameter region of the memory cell array 23.

When having determined that the loop has ended for pages at step S42 in FIG. 14, the logic control circuit 21 reads the information of the reference number of loops from the memory cell array 23 at step S21 in FIG. 12. At step S22, the logic control circuit 21 compares the actual number of loops taken for erasure with the reference number of loops. The logic control circuit 21 determines whether the actual number of loops exceeds the range of the reference number of loops (step S23). The logic control circuit 21 determines that there is no characteristic variation when the actual number of loops is equal to or smaller than the reference number of loops (step S24), or determines that there is characteristic variation when the actual number of loops exceeds the reference number of loops (step S25).

(Example 1)

The logic control circuit 21 compares the actual number of loops for the same block BLK in the previous erasure operation with the reference number of loops, and determines that there is characteristic variation when the actual number of loops is larger than a predetermined threshold value, or determines that there is no characteristic variation when the actual number of loops is equal to or smaller than the predetermined threshold value.

(Example 2)

Since erasure is performed in the unit of block BLK, it is impossible to perform comparison of the number of loops per word line. Thus, the logic control circuit 21 compares the number of loops taken for erasure of a predetermined block BLK with the number of loops taken for erasure of a next block BLK, and determines that there is characteristic variation when difference in the number of loops exceeds a predetermined threshold value, or determines that there is no characteristic variation when the difference is equal to or smaller than the predetermined threshold value. Note that, right after power-on, an initial value of the number of loops is recorded in the parameter region of the memory cell array 23 as the reference number of loops, and existence of characteristic variation is determined through comparison of the reference number of loops with the actual number of loops.

(Example 3)

In a case of the multi-plane configuration, the actual number of loops taken for erasure is compared between corresponding planes. Difference in the number of erasure loops between the corresponding planes is compared with the reference number of loops, and when the difference is, for example, equal to or smaller than the reference number of loops, it is determined that the number of loops is in the range of the reference number of loops and there is no characteristic variation. When the difference in the number of erasure loops between the corresponding planes exceeds the reference number of loops, the logic control circuit 21 determines that the number of loops is out of the range of the reference number of loops and there is characteristic variation.

(The Number of Bits)
(Example 1)

There is sometimes a cell (hereinafter referred to as an incompletely erased bit) that does not return to the erasure level through erasure processing as well. In this case, it is determined that the erase verify is successful by allowing a predetermined number of incompletely erased bits in some cases. With such a case taken into account, a reference value (reference number of incompletely erased bits) of the number of incompletely erased bits for determination of whether to perform the reading verify may be recorded in the parameter region of the memory cell array 23 at factory shipment. The reference number of incompletely erased bits is compared with the actual number of incompletely erased bits, and it is determined that there is characteristic variation when the number of incompletely erased bits exceeds the reference number of incompletely erased bits, or it is determined that there is no characteristic variation when the number of incompletely erased bits is equal to or smaller than the reference number of incompletely erased bits.

(Example 2)

The logic control circuit 21 determines that there is characteristic variation when difference in the number of incompletely erased bits between one block BLK and another block BLK in the multi-plane configuration is equal to or larger than a predetermined threshold value, or determines that there is no characteristic variation when the difference in the number of incompletely erased bits is smaller than the predetermined threshold value.

(Example 3)

The erase verify is separately performed for even-number word lines and odd-number word lines in some cases. Thus, the number of incompletely erased bits for the even-number word lines and the number of incompletely erased bits for the odd-number word lines are compared with each other, and it is determined that there is characteristic variation when difference between the numbers is equal to or larger than a predetermined threshold value, or it is determined that there is no characteristic variation when the difference in the number of incompletely erased bits is smaller than the predetermined threshold value.

(Status Failure)

In the multi-plane configuration, erase status failure indicating that erasure cannot be completed and there is erasure defect sometimes occurs at erasure of a block BLK of one plane. The logic control circuit 21 determines whether the erase status failure has occurred to the block BLK of the one plane in the characteristic variation determination at step S43 in FIG. 14. When the erase status failure has occurred, the logic control circuit 21 determines that there is variation at step S12, and performs the reading verify for a plane to which no erase status failure has occurred at step S4.

As described above in each example, the reading verify is performed only when it is determined through the characteristic variation determination that characteristic variation has occurred, and thus performance of the writing operation can be improved.

Note that although the above description is made on the example in which the characteristic variation determination is performed by the logic control circuit 21, the characteristic variation determination may be performed by another block BLK or the memory controller 1.

In this manner, effects same as the effects of the first embodiment can be obtained in the present embodiment as well.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
a memory cell array including a plurality of memory cells;
a plurality of word lines connected with respective gates of the plurality of memory cells;
a word line driver configured to apply a program voltage to the word lines at writing of data to the plurality of memory cells;
a plurality of bit lines each connected with one end of a corresponding one of the plurality of memory cells;
a bit line driver configured to apply a bit line voltage to the plurality of bit lines and detect data in the plurality of memory cells through the plurality of bit lines; and
a control circuit configured to control the word line driver and the bit line driver to execute a writing sequence in which a loop including a program operation that writes data to the memory cells and a program verify operation that verifies the data written in the memory cells is repeated a plurality of times by increasing the program voltage by a predetermined step-up voltage each time, the control circuit being capable of executing reading verify that verifies the data written in the memory cells in the writing sequence,
wherein the control circuit detects characteristic variation of a characteristic that causes disturbance, and determines whether to perform the reading verify based on a result of the detection.

2. The semiconductor storage device according to claim 1, wherein the control circuit detects the characteristic variation of the characteristic that causes disturbance at the writing, and determines whether to perform the reading verify based on a result of the detection.

3. The semiconductor storage device according to claim 2, wherein the control circuit detects, as the characteristic variation of the characteristic that causes disturbance, variation of the number of loops of the program operation and the program verify operation.

4. The semiconductor storage device according to claim 3, wherein the control circuit determines whether to perform the reading verify based on whether the variation of the number of loops exceeds a reference value at factory shipment.

5. The semiconductor storage device according to claim 4, wherein the control circuit controls the program voltage for each of a plurality of groups of the word lines in the writing sequence and determines whether to perform the reading verify by comparing the variation of the number of loops with a reference set for each group at factory shipment.

6. The semiconductor storage device according to claim 3, wherein the control circuit calculates the number of loops per page in the writing sequence and determines whether to perform the reading verify by comparing variation of the number of loops per page with a reference value.

7. The semiconductor storage device according to claim 6, wherein the control circuit controls the program voltage for each of a plurality of groups of the word lines in the writing sequence and determines whether to perform the reading verify by comparing the variation of the number of loops per page with a reference value set for each group.

8. The semiconductor storage device according to claim 3, wherein the control circuit calculates the number of loops per word line in the writing sequence and determines whether to perform the reading verify by comparing variation of the number of loops per word line with a reference value.

9. The semiconductor storage device according to claim 3, wherein
the memory cell array, the plurality of word lines, the word line driver, the plurality of bit lines, and the bit line driver are each provided in plurality in a multi-plane configuration, and
the control circuit determines whether to perform the reading verify based on comparison between the number of loops for one plane and the number of loops for another plane in the multi-plane configuration.

10. The semiconductor storage device according to claim 3, wherein when data of a plurality of levels corresponding to data of three or more values is written to the memory cells, the control circuit determines whether to perform the reading verify based on the number of loops at writing completion of a predetermined level.

11. The semiconductor storage device according to claim 2, wherein the control circuit determines whether to perform the reading verify by comparing, with a reference set for each group at factory shipment, variation of the number of failed cells for the program verify operation after a predetermined number of loops is reached in the writing sequence.

12. The semiconductor storage device according to claim 2, wherein
the memory cell array, the plurality of word lines, the word line driver, the plurality of bit lines, and the bit line driver are each provided in plurality in a multi-plane configuration, and
when failure of data writing to the memory cells occurs at one plane in the multi-plane configuration, the control circuit performs the reading verify at another plane.

13. The semiconductor storage device according to claim 1, wherein at erasure in which an erasure loop including an erasure operation that erases data written in the memory cells and an erase verify that verifies erasure of the data is repeated, the control circuit detects the characteristic variation of the characteristic that causes disturbance, and determines whether to perform the reading verify based on a result of the detection.

14. The semiconductor storage device according to claim 13, wherein the control circuit detects variation of the number of erasure loops as the characteristic variation of the characteristic that causes disturbance.

15. The semiconductor storage device according to claim 14, wherein the control circuit determines whether to perform the reading verify based on whether the variation of the number of erasure loops exceeds a reference value at factory shipment.

16. The semiconductor storage device according to claim 14, wherein the control circuit determines whether to perform the reading verify by comparing the variation of the number of erasure loops for erasure at an identical block in the memory cell array with a reference value.

17. The semiconductor storage device according to claim 14, wherein the control circuit determines whether to perform the reading verify by comparing, with a reference value, a difference in the number of erasure loops between continuous erasure operations at different blocks of the memory cell array.

18. The semiconductor storage device according to claim 14, wherein
the memory cell array, the plurality of word lines, the word line driver, the plurality of bit lines, and the bit line driver are each provided in plurality in a multi-plane configuration, and
the control circuit determines whether to perform the reading verify based on comparison between the number of erasure loops at one plane in the multi-plane configuration and the number of erasure loops at another plane.

19. The semiconductor storage device according to claim 14, wherein the control circuit determines whether to perform the reading verify by comparing variation of the number of failed cells in the erase verify with a reference at factory shipment.

20. The semiconductor storage device according to claim 14, wherein
the memory cell array, the plurality of word lines, the word line driver, the plurality of bit lines, and the bit line driver are each provided in plurality in a multi-plane configuration, and
the control circuit determines whether to perform the reading verify based on comparison between the number of failed cells in the erase verify at one plane in the multi-plane configuration and the number of failed cells in the erase verify at another plane.

21. The semiconductor storage device according to claim 14, wherein when separately performing the erase verify for even-number word lines or odd-number word lines, the control circuit determines whether to perform the reading verify based on comparison between the number of failed cells for the even-number word lines and the number of failed cells for the odd-number word lines.

22. The semiconductor storage device according to claim 14, wherein
the memory cell array, the plurality of word lines, the word line driver, the plurality of bit lines, and the bit line driver are each provided in plurality in a multi-plane configuration, and
when failure of erasure of data in the memory cells occurs at one plane in the multi-plane configuration, the control circuit performs the reading verify at another plane.

* * * * *